(12) United States Patent
Zhang et al.

(10) Patent No.: US 12,550,429 B2
(45) Date of Patent: Feb. 10, 2026

(54) DISPLAY SUBSTRATE AND METHOD FOR MANUFACTURING THE SAME

(71) Applicant: BOE Technology Group Co., Ltd., Beijing (CN)

(72) Inventors: Zhen Zhang, Beijing (CN); Fuqiang Li, Beijing (CN); Hongrun Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 675 days.

(21) Appl. No.: 17/555,201

(22) Filed: Dec. 17, 2021

(65) Prior Publication Data

US 2022/0310664 A1    Sep. 29, 2022

(30) Foreign Application Priority Data

Mar. 23, 2021 (CN) .......................... 202110309555.4

(51) Int. Cl.
*H10D 86/01* (2025.01)
*H10D 86/40* (2025.01)
*H10D 86/60* (2025.01)

(52) U.S. Cl.
CPC ....... *H10D 86/0221* (2025.01); *H10D 86/471* (2025.01); *H10D 86/60* (2025.01); *H10D 86/423* (2025.01)

(58) Field of Classification Search
None
See application file for complete search history.

(56) References Cited

U.S. PATENT DOCUMENTS

| | | | |
|---|---|---|---|
| 10,916,185 B1* | 2/2021 | Dai | H10H 20/8312 |
| 2018/0151654 A1* | 5/2018 | Lee | H10K 59/1216 |
| 2019/0229131 A1* | 7/2019 | Chung | H01L 27/1248 |
| 2020/0135825 A1* | 4/2020 | Cha | G09G 3/3266 |
| 2021/0074785 A1* | 3/2021 | Kim | H10K 59/1216 |
| 2022/0310731 A1* | 9/2022 | Chen | H10K 59/1213 |

FOREIGN PATENT DOCUMENTS

CN        106169275 A        11/2016

* cited by examiner

*Primary Examiner* — Michelle Mandala
(74) *Attorney, Agent, or Firm* — IPro, PLLC (57) ABSTRACT

The present application provides a display substrate and a method for manufacturing the same. The display substrate includes: a base substrate; and at least two layers of pixel circuits on the base substrate. The at least two layers of pixel circuits include a first-layer pixel circuit and a second-layer pixel circuit which are in different layers; the first-layer pixel circuit includes a plurality of first thin film transistors; the second-layer pixel circuit includes a plurality of second thin film transistors; and an orthographic projection of at least one first thin film transistor onto the base substrate at least partially overlaps an orthographic projection of at least one second thin film transistor onto the base substrate.

20 Claims, 5 Drawing Sheets

DISPLAY SUBSTRATE AND METHOD FOR MANUFACTURING THE SAME

CROSS-REFERENCE TO RELATED APPLICATIONS

The present application claims a priority to the Chinese patent application No. 202110309555.4 filed in China on Mar. 23, 2021, a disclosure of which is incorporated herein by reference in its entirety.

TECHNICAL FIELD

The present application relates to the field of display technologies, and in particular to a display substrate and a method for manufacturing the same.

BACKGROUND

In recent years, with diversified expansion of virtual reality (VR) and augmented reality (AR) application fields, the demand for VR and AR products has grown rapidly. A display panel is one of core hardware of the VR and AR products, and requires more pixel viewpoints to restore a real scene, and its demand for pixel density (pixels per inch, PPI) is getting higher and higher. The higher the PPI demand of the display panel, the smaller an area occupied by a single pixel and the smaller an available space for a pixel circuit. The pixel circuit in the related art has a complicated compensation structure, and then the pixel circuit occupies a large area in a panel design layout, which is not conducive to design of a display panel with high PPI.

SUMMARY

In a first aspect, one embodiment of the present application provides a display substrate, including: a base substrate; and at least two layers of pixel circuits on the base substrate. The at least two layers of pixel circuits include a first-layer pixel circuit and a second-layer pixel circuit which are in different layers; the first-layer pixel circuit includes a plurality of first thin film transistors; the second-layer pixel circuit includes a plurality of second thin film transistors; and an orthographic projection of at least one first thin film transistor onto the base substrate at least partially overlaps an orthographic projection of at least one second thin film transistor onto the base substrate.

Optionally, at least two of the first thin film transistors are different types of thin film transistors with active layers of different materials, or all of the first thin film transistors are the same type of thin film transistors with the active layers of the same material; at least two of the second thin film transistors are different types of thin film transistors with active layers of different materials, or all of the second thin film transistors are the same type of thin film transistors with the active layers of the same material; and at least one of the first thin film transistors and at least one of the second thin film transistors are different types of thin film transistors with active layers of different materials, or, at least one of the first thin film transistors and at least one of the second thin film transistors are the same type of thin film transistors with the active layers of the same material.

Optionally, at least one of the first thin film transistors is at least one of a metal oxide thin film transistor with a metal oxide active layer, a low temperature polysilicon thin film transistor with a low temperature polysilicon active layer, and an amorphous silicon thin film transistor with an amorphous silicon active layer; at least one of the second thin film transistors is at least one of a metal oxide thin film transistor with a metal oxide active layer, a low temperature polysilicon thin film transistor with a low temperature polysilicon active layer, and an amorphous silicon thin film transistor with an amorphous silicon active layer.

Optionally, the display substrate includes at least three sub-pixels; the at least three sub-pixels include a first sub-pixel, a second sub-pixel, and a third sub-pixel; each sub-pixel is provided with a corresponding pixel electrode; the pixel electrode of at least one first sub-pixel is coupled to at least one first thin film transistor having an oxide active layer or an amorphous silicon active layer, or coupled to at least one second thin film transistor having an oxide active layer or an amorphous silicon active layer; the pixel electrode of at least one second sub-pixel is coupled to at least one first thin film transistor having an oxide active layer or an amorphous silicon active layer, or coupled to at least one second thin film transistor having an oxide active layer or an amorphous silicon active layer; and the pixel electrode of at least one third sub-pixel is coupled to at least one first thin film transistor having a low-temperature polysilicon active layer, or coupled to at least one second thin film transistor having a low-temperature polysilicon active layer.

Optionally, the first sub-pixel is a green sub-pixel, the second sub-pixel is a blue sub-pixel and the third sub-pixel is a red sub-pixel.

Optionally, each first thin film transistor in the first-layer pixel circuit is a metal oxide thin film transistor or an amorphous silicon thin film transistor; each second thin film transistor in the second-layer pixel circuit is a low-temperature polysilicon thin film transistor; each of the pixel electrodes of the first sub-pixel and the second sub-pixel is coupled to the corresponding first thin film transistor in the first-layer pixel circuit; and the pixel electrode of the third sub-pixel is coupled to the corresponding second thin film transistor in the second-layer pixel circuit.

Optionally, the first thin film transistor and the second thin film transistor are both NMOS transistors.

Optionally, the first thin film transistor is coupled to the pixel electrode in the corresponding sub-pixel through a first via-hole; and the second thin film transistor is coupled to the pixel electrode in the corresponding sub-pixel through a second via-hole; an orthographic projection of the first thin film transistor onto the base substrate and an orthographic projection of the second thin film transistor onto the base substrate at least partially do not overlap each other, with a non-overlapping area defined between the orthographic projection of the first thin film transistor onto the base substrate and the orthographic projection of the second thin film transistor onto the base substrate; the first via-hole and the second via-hole are both located in the non-overlapping area; and an orthographic projection of the first via-hole onto the base substrate does not overlap an orthographic projection of the second via-hole onto the base substrate.

Optionally, the first via-hole and the second via-hole are located at two sides of the non-overlapping area.

Optionally, the display substrate includes two opposite sides; one of the two opposite sides is provided with a first gate driving circuit, and the other one of the two opposite sides is provided with a second gate driving circuit; the first-layer pixel circuit is coupled to the first gate driving circuit, and the second-layer pixel circuit is coupled to the second gate driving circuit; and the first gate driving circuit and the second gate driving circuit are independent of each other.

Optionally, the first gate driving circuit and the second gate driving circuit are gate driver on array (GOA) driving circuits or a gate chip on flex/film (COF) driving circuits.

Optionally, the display substrate specifically includes: a buffer layer on the base substrate; wherein the first-layer pixel circuit is on the buffer layer, and the first thin film transistor in the first-layer pixel circuit includes: a first active layer, a first gate electrode, a first source electrode and a first drain electrode; a first gate insulating layer located between the first active layer and the first gate electrode; a first interlayer dielectric layer located between the first gate electrode and the first source electrode together with the first drain electrode; a base layer located on the first-layer pixel circuit, wherein the base layer is an organic insulating layer or an inorganic insulating layer; wherein the second-layer pixel circuit is located on the base layer, and the second thin film transistor in the second-layer pixel circuit includes: a second active layer, a second gate electrode, a second source electrode and a second drain electrode; a second gate insulating layer located between the second active layer and the second gate electrode; a second interlayer dielectric layer located between the second gate electrode and the second source electrode together with the second drain electrode; a planarization layer located on the second interlayer dielectric layer and covering the second source electrode and the second drain electrode; and a pixel electrode layer located on the planarization layer, wherein the pixel electrode layer includes a plurality of pixel electrodes corresponding to various sub-pixels, some of the pixel electrodes are coupled to the first source electrodes through first via-holes in the planarization layer, some of the pixel electrodes are coupled to the second source electrodes through second via-holes in the planarization layer, and the first via-hole extends through the planarization layer, the second interlayer dielectric layer, the second gate insulating layer and the base layer.

Optionally, the display substrate specifically includes: a buffer layer on the base substrate; wherein the first-layer pixel circuit is on the buffer layer, and the first thin film transistor in the first-layer pixel circuit includes: a first active layer, a first gate electrode, a first source electrode and a first drain electrode; a first gate insulating layer located between the first active layer and the first gate electrode; a first interlayer dielectric layer located between the first gate electrode and the first source electrode together with the first drain electrode; a base layer located on the first-layer pixel circuit, wherein the base layer is an organic insulating layer or an inorganic insulating layer; wherein the second-layer pixel circuit is located on the base layer, and the second thin film transistor in the second-layer pixel circuit includes: a second active layer, a second gate electrode, a second source electrode and a second drain electrode; a second gate insulating layer located between the second active layer and the second gate electrode; a second interlayer dielectric layer located on the second gate insulating layer and covering the second source electrode and the second drain electrode; a planarization layer located on the second interlayer dielectric layer; and a pixel electrode layer located on the planarization layer, wherein the pixel electrode layer includes a plurality of pixel electrodes corresponding to various sub-pixels, some of the pixel electrodes are coupled to the first source electrodes through first via-holes in the planarization layer, some of the pixel electrodes are coupled to the second source electrodes through second via-holes in the planarization layer, and the first via-hole extends through the planarization layer, the second interlayer dielectric layer, the second gate insulating layer and the base layer; and the second via-hole extends through the planarization layer and into the second interlayer dielectric layer.

In a second aspect, one embodiment of the present application provides a method for manufacturing a display substrate, including: providing a base substrate; and forming at least two layers of pixel circuits on the base substrate; wherein the at least two layers of pixel circuits includes a first-layer pixel circuit and a second-layer pixel circuit which are in different layers, the first-layer pixel circuit includes a plurality of first thin film transistors, the second-layer pixel circuit includes a plurality of second thin film transistors, and an orthographic projection of at least one first thin film transistor onto the base substrate at least partially overlaps an orthographic projection of at least one second thin film transistor onto the base substrate.

Optionally, the forming at least two layers of pixel circuits on the base substrate, includes: forming a buffer layer on the base substrate; forming the first-layer pixel circuit on the buffer layer; forming a base layer on the first-layer pixel circuit, wherein the base layer is an organic insulating layer or an inorganic insulating layer; forming the second-layer pixel circuit on the base layer; forming a pixel electrode layer on the second-layer pixel circuit.

Optionally, the forming the first-layer pixel circuit on the buffer layer, includes: forming a first active layer on the buffer layer; forming a first gate insulating layer on the buffer layer, wherein the first gate insulating layer covers the first active layer; forming a first gate electrode on the first gate insulating layer; forming a first interlayer dielectric layer on the first gate insulating layer, wherein the first interlayer dielectric layer covers the first gate electrode; forming a first source electrode and a first drain electrode on the first interlayer dielectric layer; wherein the forming the second-layer pixel circuit on the base layer, includes: forming a second active layer on the base layer; forming a second gate insulating layer on the base layer, wherein the second gate insulating layer covers the second active layer; forming a second gate electrode on the second gate insulating layer; forming a second interlayer dielectric layer on the second gate insulating layer, wherein the second interlayer dielectric layer covers the second gate; forming a second source electrode and a second drain electrode on the second interlayer dielectric layer; forming a planarization layer on the second interlayer dielectric layer; wherein the pixel electrode layer includes a plurality of pixel electrodes corresponding to various sub-pixels, some of the pixel electrodes are coupled to the first source electrodes through first via-holes in the planarization layer, some of the pixel electrodes are coupled to the second source electrodes through second via-holes in the planarization layer, and the first via-hole extends through the planarization layer, the second interlayer dielectric layer, the second gate insulating layer and the base layer.

Optionally, the forming the first-layer pixel circuit on the buffer layer, includes: forming a first active layer on the buffer layer; forming a first gate insulating layer on the buffer layer, wherein the first gate insulating layer covers the first active layer; forming a first gate electrode on the first gate insulating layer; forming a first interlayer dielectric layer on the first gate insulating layer, wherein the first interlayer dielectric layer covers the first gate electrode; forming a first source electrode and a first drain electrode on the first interlayer dielectric layer; wherein the forming the second-layer pixel circuit on the base layer, includes: forming a second gate electrode on the base layer; forming a second gate insulating layer on the base layer, wherein the second gate insulating layer covers the second gate electrode; forming a second active layer on the second gate insulating layer; forming a second source electrode and a second drain electrode on the second active layer; forming a second interlayer dielectric layer on the second gate insulating layer, wherein the second interlayer dielectric layer covers the second source electrode and the second drain electrode; forming a planarization layer on the second interlayer dielectric layer; wherein the pixel electrode layer includes a plurality of pixel electrodes corresponding to various sub-pixels, some of the pixel electrodes are coupled to the first source electrodes through first via-holes in the planarization layer, some of the pixel electrodes are coupled to the second source electrodes through second via-holes in the planarization layer, and the first via-hole extends through the planarization layer, the second interlayer dielectric layer, the second gate insulating layer and the base layer; and the second via-hole extends through the planarization layer and into the second interlayer dielectric layer.

Additional aspects and advantages of the present application will be given in the following description, which will become apparent from the following description, or be understood through practice of the present application.

BRIEF DESCRIPTION OF THE DRAWINGS

The foregoing and/or additional aspects and advantages of the present application will become apparent and easy to understand from the following description of the embodiments in conjunction with the accompanying drawings, in which.

DETAILED DESCRIPTION

Reference will now be made in detail to the exemplary embodiments of the present application, examples of which are illustrated in the accompanying drawings, wherein the various details of the embodiments of the present application are included to facilitate understanding and are to be considered as exemplary only. Accordingly, a person skilled in the art should appreciate that various changes and modifications can be made to the embodiments described herein without departing from the scope and spirit of the present application. Also, descriptions of well-known functions and structures are omitted from the following description for clarity and conciseness.

The terms such as "first" and "second" in the specification and claims of the present application are merely used to differentiate similar components rather than to represent any order or sequence. It is to be understood that the data so used may be interchanged where appropriate, such that the embodiments of the present application described herein may be implemented in a sequence other than those illustrated or described herein. In addition, the terms "include" and "have" or their variations are intended to encompass a non-exclusive inclusion, such that a process, method, system, product, or device that include a series of steps or units include not only those steps or units that are explicitly listed but also other steps or units that are not explicitly listed, or steps or units that are inherent to such process, method, product, or device. In the specification and claims, "and/or" means at least one of the connected objects.

Before describing in details a display substrate and a method for manufacturing the same according to embodiments of the present application, it is necessary to describe the related art as follows.

In the related art, in order to ensure display effects, thin film transistors (TFT) in a pixel circuit of a display substrate are all fabricated in an identical layer, and the pixel circuit requires a complicated compensation circuit such as 7T1C or 6T1C compensation circuit. Further, in order to ensure circuit performance, it is necessary to ensure that the thin film transistor in the pixel circuit has a certain size. Therefore, in a panel design layout, the pixel circuit needs to occupy a larger space, and this limits improvement of PPI of a display panel, which is not conducive to design of a display panel with high PPI.

In order to solve the foregoing problems, embodiments of the present application provide a display substrate and a method for manufacturing the same, which can effectively increase an available space for pixel circuits and realize design of a display panel with ultra-high PPI.

Figure 1:
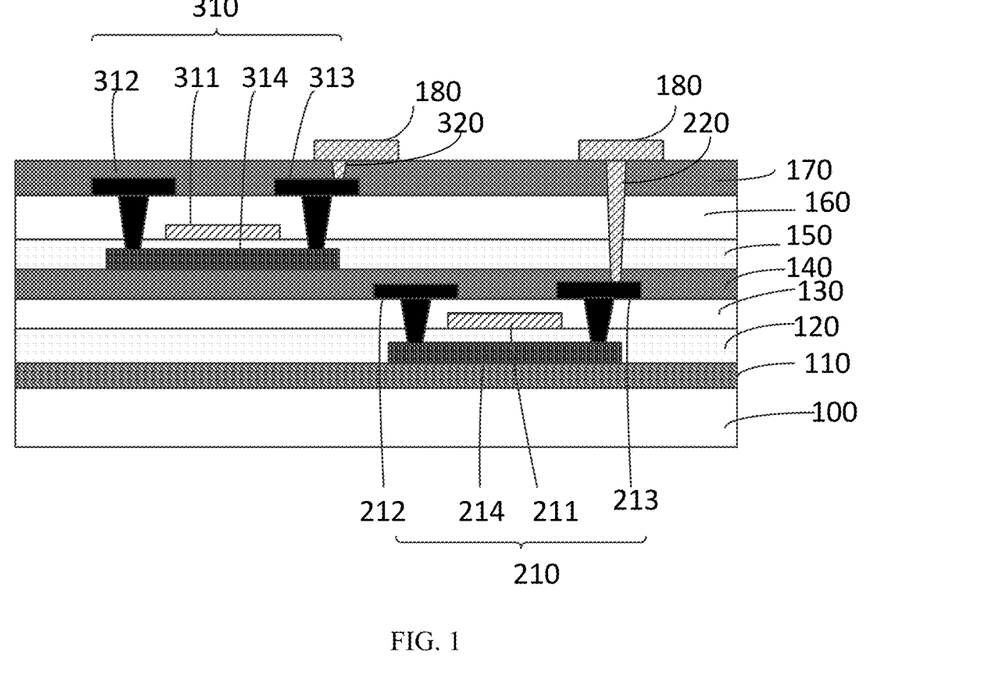
FIG. 1 is a schematic diagram of a display substrate according to some embodiments of the present application.
Figure 2:
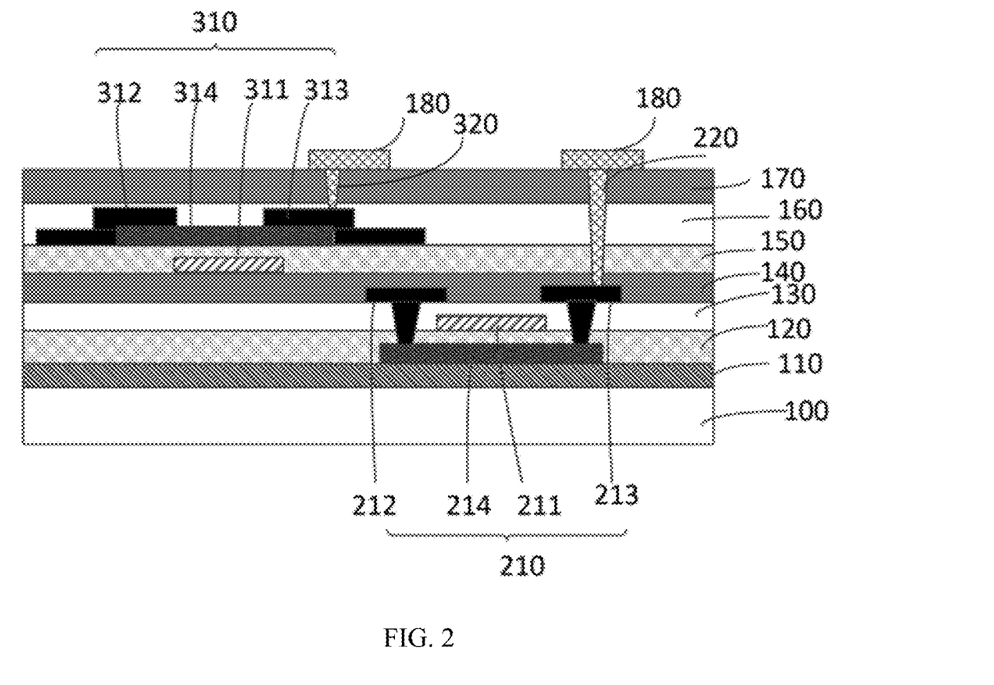
FIG. 2 is a schematic diagram of a display substrate according to another some embodiments of the present application.
Figure 5:
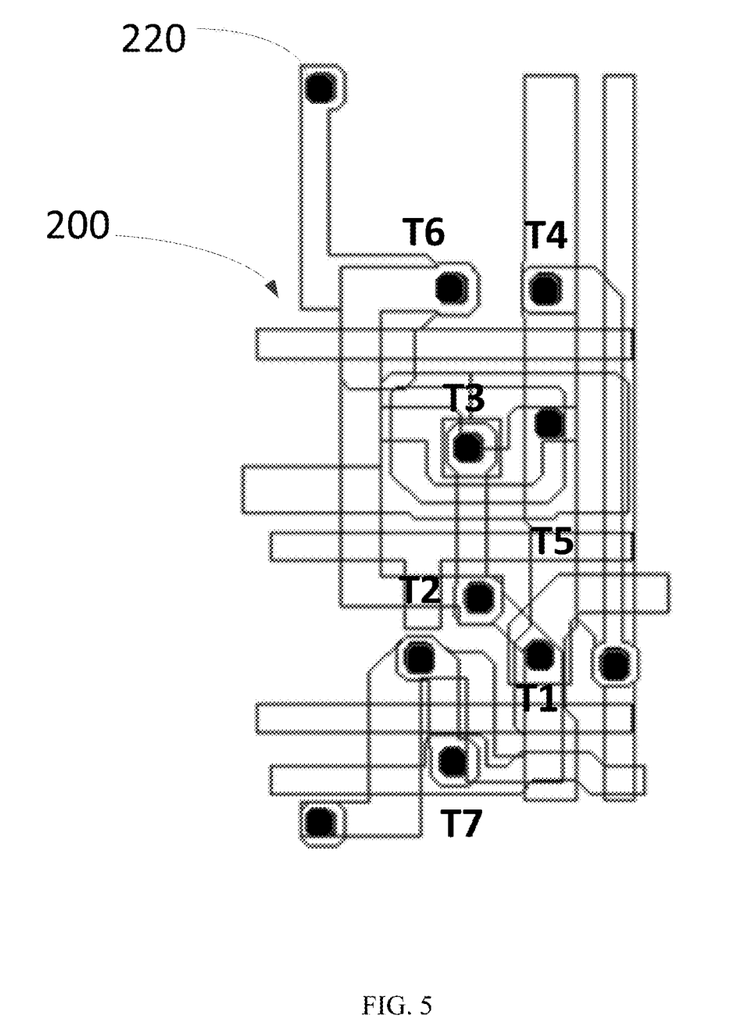
FIG. 5 is a schematic plan view of a first-layer pixel circuit of a display substrate according to some embodiments of the present application.
Figure 6:
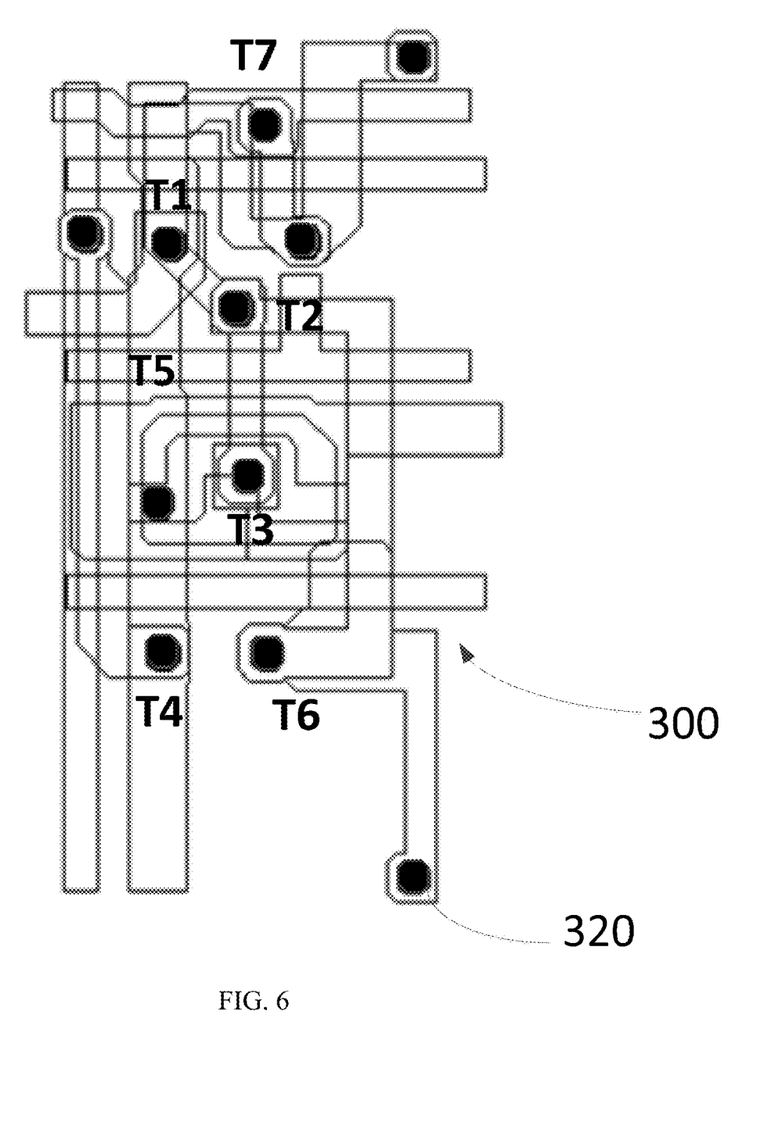
FIG. 6 is a schematic plan view of a second-layer pixel circuit of a display substrate according to some embodiments of the present application.
Figure 7:
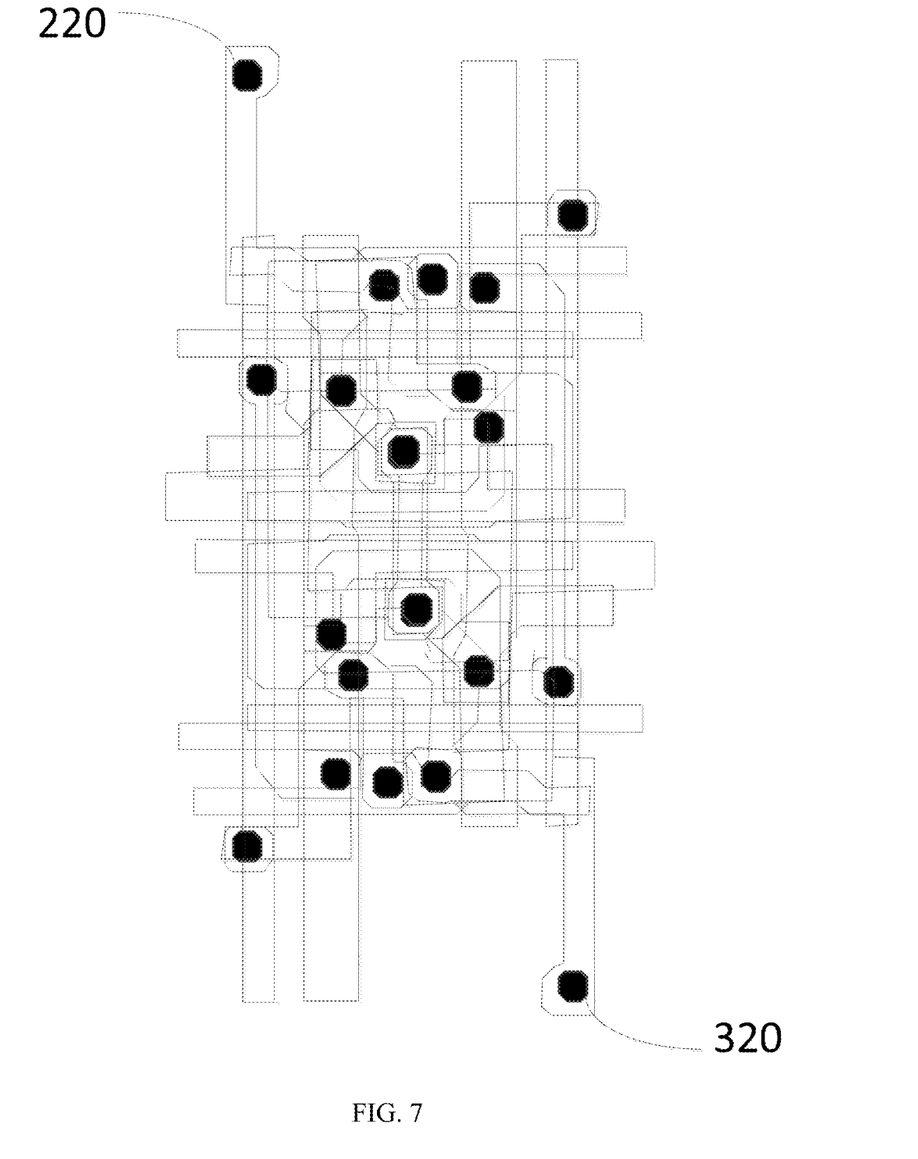
FIG. 7 is a schematic plan view of the first-layer pixel circuit shown in FIG. 5 overlapped with the second-layer pixel circuit shown in FIG. 6 according to some embodiments of the present application.

FIG. 1 and FIG. 2 are schematic cross-sectional views of display substrates in several exemplary embodiments; FIG. 5 is a schematic plan view of a first-layer pixel circuit of a display substrate according to some embodiments of the present application; FIG. 6 is a schematic plan view of a second-layer pixel circuit of a display substrate according to some embodiments of the present application; and FIG. 7 is a schematic plan view of the first-layer pixel circuit overlapped with the second-layer pixel circuit according to some embodiments of the present application.

As shown in FIG. 1 to FIG. 7, a display substrate according to an embodiment of the present application includes: a base substrate 100 and at least two layers of pixel circuits formed on the base substrate 100. The at least two layers of pixel circuits include a first-layer pixel circuit 200 and a second-layer pixel circuit 300 which are in different layers. The first-layer pixel circuit 200 includes a plurality of first thin film transistors 210. The second-layer pixel circuit 300 includes a plurality of second thin film transistors 310. An orthographic projection of at least one first thin film transistor 210 onto the base substrate 100 at least partially overlaps an orthographic projection of at least one second thin film transistor 310 onto the base substrate 100.

In the foregoing solution, at least two layers of pixel circuits are arranged in the display substrate, that is, at least two layers of thin film transistors are arranged in the display substrate; and in a direction perpendicular to the base substrate 100, the orthographic projections of the thin film transistors in different layers of pixel circuits onto the base substrate 100 at least partially overlap each other. Such design of at least two layers of thin film transistors increases an available space of the pixel circuit by at least 1 time, as compared with the same PPI design of a single-layer of thin film transistors in the related art.

For example, in the current process level, due to space limitations of the pixel circuit, the design of a single-layer of thin film transistors may achieve 1000 PPI display; then, without changing the process level, the design of two layers of thin film transistors can achieve 2000 PPI display. If a higher PPI display is required, more than two layers of thin film transistors can be fabricated accordingly. Such design of multiple layers of thin film transistors can achieve ultra-high PPI display.

It should be noted that, in the display substrate provided in the embodiments of the present application, each layer of thin film transistors may be fabricated separately, and form a layer of pixel circuit separately.

The thin film transistors of different layers may not affect each other, and may be fabricated by using the same or different processes. The display substrate provided in the embodiments of the present application will be described in more detail hereinafter.

There are many types of thin film transistors. For example, the thin film transistors may be divided into many types according to materials of active layers; that is, the thin film transistors may be divided into many types according to different semiconductor manufacturing processes, such as a metal oxide thin film transistor (IGZO TFT) with a metal oxide active layer, a low temperature polysilicon thin film transistor (LTPS TFT) with a low temperature polysilicon active layer, and an amorphous silicon thin film transistor (a-Si TFT) with an amorphous silicon active layer.

In some embodiments, in the first-layer pixel circuit, at least two of the first thin film transistors 210 may be different types of thin film transistors with active layers of different materials, or each of the first thin film transistors 210 is the same type of thin film transistors with active layers of the same material; in the second-layer pixel circuit, at least two of the second thin film transistors 310 may be different types of thin film transistors with active layers of different materials, or each of the second thin film transistors 310 is the same type of thin film transistors with active layers of the same material. In other words, various thin film transistors located in an identical layer of pixel circuit may be the same type of thin film transistors with active layers of the same material, or different types of thin film transistors with active layers of different materials.

In addition, in some exemplary embodiments, at least one of the first thin film transistors 210 and at least one of the second thin film transistors 310 are different types of thin film transistors with active layers of different materials; or, at least one of the first thin film transistors 210 and at least one of the second thin film transistors 310 are the same type of thin film transistors with active layers of the same material. In other words, the thin film transistors located in different layers may be the same type of thin film transistors with active layers of the same material, or different types of thin film transistors with active layers of different materials.

For example, at least one of the first thin film transistors 210 may be at least one of a metal oxide thin film transistor with a metal oxide active layer, a low temperature polysilicon thin film transistor with a low temperature polysilicon active layer, and an amorphous silicon thin film transistor with an amorphous silicon active layer. At least one of the second thin film transistors 310 may be at least one of a metal oxide thin film transistor with a metal oxide active layer, a low temperature polysilicon thin film transistor with a low temperature polysilicon active layer, and an amorphous silicon thin film transistor with an amorphous silicon active layer.

As an exemplary embodiment, in the embodiment shown in FIG. 1, the first thin film transistors 210 in the first-layer pixel circuit 200 and the second thin film transistors 310 in the second-layer pixel circuit 300 are the same type of thin film transistors which are fabricated through the same semiconductor process. For example, the first thin film transistors 210 and the second thin film transistors 310 in the embodiment shown in FIG. 1 are LTPS TFTs.

As an exemplary embodiment, in the embodiment shown in FIG. 2, the first thin film transistor 210 in the first-layer pixel circuit 200 and the second thin film transistor 310 in the second-layer pixel circuit 300 are different types of thin film transistors which are fabricated through different semiconductor processes. For example, in the embodiment shown in FIG. 2, the first thin film transistors 210 are LTPS TFTs, and the second thin film transistors 310 are IGZO TFTs.

In addition, the display substrate provided in the embodiment of the present application includes at least three sub-pixels. The at least three sub-pixels include a first sub-pixel, a second sub-pixel, and a third sub-pixel, which are corresponding to different light-emitting colors. Each sub-pixel is provided with a corresponding pixel electrode. For example, a first pixel electrode is provided in the first sub-pixel; a second pixel electrode is provided in the second sub-pixel; and a third pixel electrode is provided in the third sub-pixel. Taking the display substrate being an OLED display substrate as an example, the pixel electrode may refer to an anode of an organic light-emitting unit.

Figure 3:
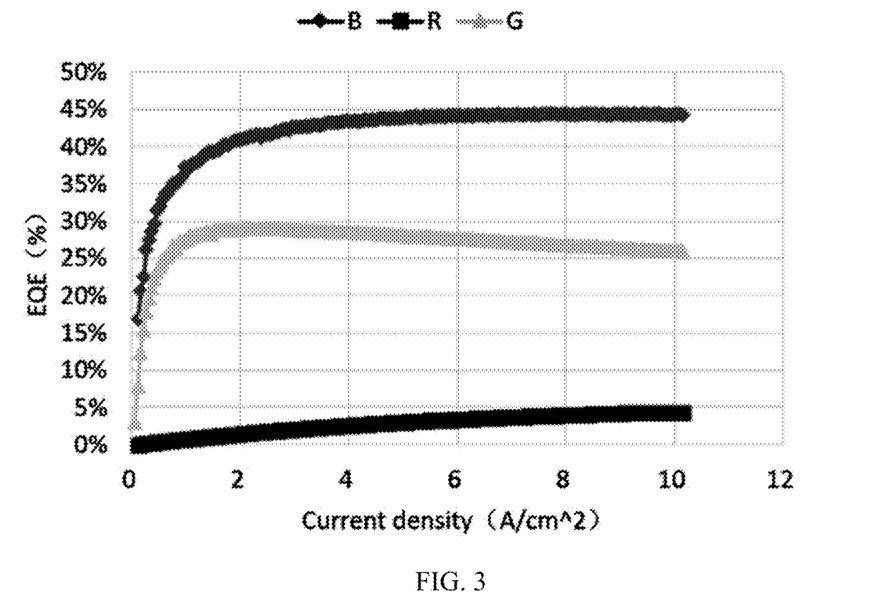
FIG. 3 is a schematic diagram showing luminous efficiencies of sub-pixels of different colors.

The sub-pixels of different colors are made of different luminescent materials, and have different luminous efficiencies. The luminous efficiencies of sub-pixels of different colors are shown in FIG. 3. The at least two layers of thin film transistors may be fabricated by using different processes. The sub-pixels of different colors require different light-emitting currents. According to the light-emitting currents required by the sub-pixels of different colors, pixel electrodes of various sub-pixels of different colors are matched with different types of thin film transistors to achieve currents required by various sub-pixels.

Under the same current density, blue luminescent materials have the highest luminous efficiency, green luminescent materials have the second highest luminous efficiency, and red luminescent materials have the lowest luminous efficiency. The luminous efficiency of the red luminescent materials is quite different from the luminous efficiencies of the blue luminescent materials and the green luminescent materials. Therefore, in the pixel structure design of multiple layers of thin film transistors, in order to achieve uniform light emission of the sub-pixels of different colors, a red pixel requires a larger driving current, and a blue sub-pixel and a green sub-pixel require a smaller driving current.

Therefore, as an exemplary embodiment, in case that the first sub-pixel may be a green sub-pixel, the second sub-pixel may be a blue sub-pixel and the third sub-pixel may be a red sub-pixel, the pixel electrode of at least one of the first sub-pixels is coupled to at least one first thin film transistor 210 having an oxide active layer or an amorphous silicon active layer, or coupled to at least one second thin film transistor 310 having an oxide active layer or an amorphous silicon active layer; the pixel electrode of at least one of the second sub-pixels is coupled to at least one first thin film transistor 210 having an oxide active layer or an amorphous silicon active layer, or coupled to at least one second thin film transistor 310 having an oxide active layer or an amorphous silicon active layer; and the pixel electrode of at least one of the third sub-pixels is coupled to at least one first thin film transistor 210 having a low-temperature polysilicon active layer, or coupled to at least one second thin film transistor 310 having a low-temperature polysilicon active layer.

In other words, a first pixel electrode in the first sub-pixel is coupled to an IGZO TFT or a-si TFT; a second pixel electrode in the second sub-pixel is coupled to an IGZO TFT or a-si TFT; and a third pixel electrode in the third sub-pixel is coupled to an LTPS TFT.

In the above solution, in order to achieve uniform light emission of the sub-pixels of different colors, the red sub-pixel requires a larger driving current, and thus the active layer of the thin film transistor in the pixel circuit used for the red sub-pixel is fabricated through the LTPS semiconductor process with a larger driving current; and the blue sub-pixel and the green sub-pixel require smaller driving currents, and thus the active layers of the thin film transistors in the pixel circuit used for the blue sub-pixel and the green sub-pixel are fabricated through the IGZO or A-si semiconductor process with a relatively smaller driving current. In addition, since the IGZO semiconductor process has better uniformity, lower leakage current and better performance and yield improvement, the blue sub-pixel and the green sub-pixel may be fabricated through the IGZO semiconductor process.

Generally, the LTPS TFT may be fabricated through the Nmos process or the Pmos process, and the IGZO TFT is usually fabricated through the Nmos process. In the at least two layers of pixel circuits of the display substrate provided in the embodiment of the present application, in case that the LTPS TFT is fabricated through the Pmos process, and the IGZO TFT is fabricated through the Nmos process, display IC driving needs to be divided into positive and negative voltage driving. Therefore, in some exemplary embodiments, the first thin film transistor 210 and the second thin film transistor 310 are both NMOS transistors, and then there is no need for sub-pixels of different colors to distinguish between positive and negative pressure driving.

In addition, the first-layer pixel circuit 200 is composed of first thin film transistors 210 located in a first layer and having active layers of the same material; and the second-layer pixel circuit 300 is composed of second thin film transistors 310 located in a second layer and having active layers of the same material. The thin film transistors in the two layers of pixel circuits are overlapped in a direction perpendicular to the base substrate 100. The pixel circuit for sub-pixels of one color may be composed of a single-layer pixel circuit; or, pixel circuits for sub-pixels of different colors may be layered according to materials of the active layers required by current requirements of the sub-pixels of different colors. For example, the pixel circuit for the red sub-pixels is composed of the first-layer pixel circuit 200; and the pixel circuit for the blue sub-pixel and the green sub-pixel is composed of the second-layer pixel circuit 300. In this way, even if the thin film transistors in the multiple layers of pixel circuits adopt different processes, for the same pixel unit, the thin film transistors made by one semiconductor process are used.

Specifically, as an exemplary embodiment, as shown in FIG. 2, each first thin film transistor 210 in the first-layer pixel circuit 200 is a metal oxide thin film transistor or an amorphous silicon thin film transistor; each second thin film transistor 310 in the second-layer pixel circuit 300 is a low-temperature polysilicon thin film transistor. Each of the pixel electrodes of the first sub-pixels and the second sub-pixels is coupled to the corresponding first thin film transistor 210 in the first-layer pixel circuit 200. Each of the pixel electrodes of the third sub-pixels is coupled to the corresponding second thin film transistor 310 in the second-layer pixel circuit 300.

Figure 4:
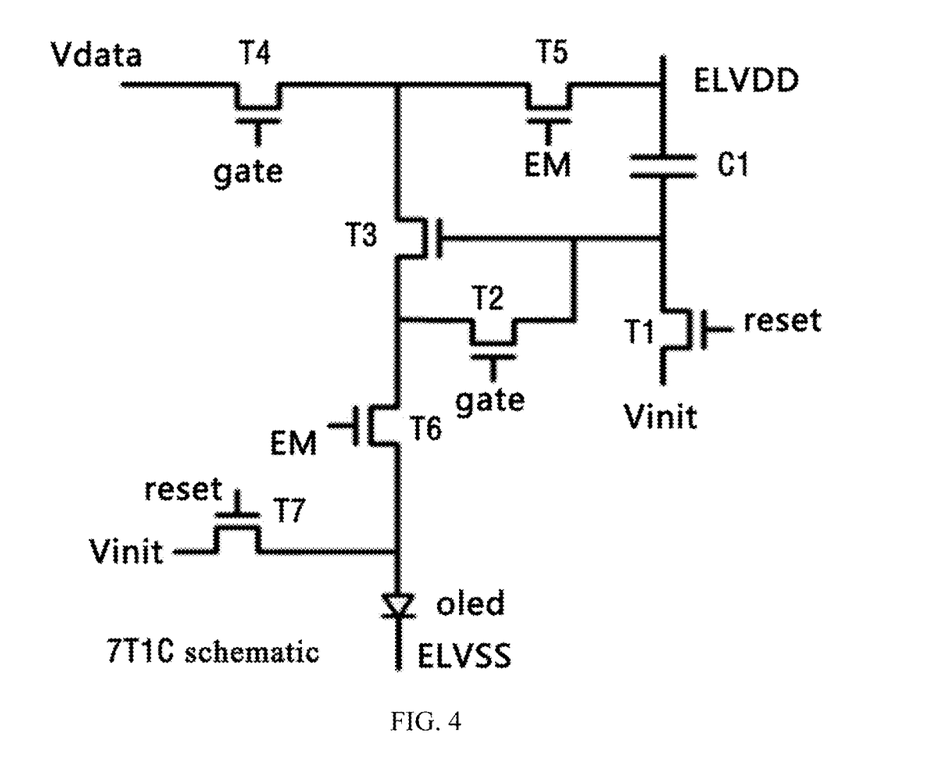
FIG. 4 is a schematic diagram of a 7T1C pixel compensation circuit.

In addition, FIG. 5 is a partial enlarged plan view of the first-layer pixel circuit 200, FIG. 6 is a partial enlarged plan view of the second-layer pixel circuit 300, and FIG. 7 is a schematic plan view of the first-layer pixel circuit 200 overlapped with the second-layer pixel circuit 300. FIG. 4 is a schematic diagram of a 7T1C pixel compensation circuit for the first-layer pixel circuit 200 and the second-layer pixel circuit 300. It should be understood that FIG. 4 to FIG. 7 are only an example, and the specific structure of the pixel circuit is not limited here.

As shown in FIG. 5 to FIG. 7, the first thin film transistor 210 is coupled to the pixel electrode in the corresponding sub-pixel through a first via-hole 220; and the second thin film transistor 310 is coupled to the pixel electrode in the corresponding sub-pixel through a second via-hole 320. An orthographic projection of the first thin film transistor 210 onto the base substrate 100 and an orthographic projection of the second thin film transistor 310 onto the base substrate 100 at least partially do not overlap each other, and then there is a non-overlapping area between the orthographic projection of the first thin film transistor 210 onto the base substrate 100 and the orthographic projection of the second thin film transistor 310 onto the base substrate 100. The first via-hole 220 and the second via-hole 320 are both located in the non-overlapping area. An orthographic projection of the first via-hole 220 onto the base substrate 100 does not overlap an orthographic projection of the second via-hole 320 onto the base substrate 100.

As an exemplary embodiment, as shown in FIG. 7, taking two adjacent pixel electrodes in the display substrate as an example, after the first-layer pixel circuit 200 and the second-layer pixel circuits 300 are stacked, a pixel electrode via-hole (i.e., the first via-hole 220) in the first-layer pixel circuit 200 is located at one side of the first-layer pixel circuit 200 (i.e., an upper left corner side in FIG. 7); and a pixel electrode via-hole (i.e., the second via-hole 320) in the second-layer pixel circuit 300 is located at other side of the second-layer pixel circuit 300 (i.e., a lower right side in FIG. 7). That is, the first via-hole 220 and the second via-hole 320 are located at two opposite sides far apart. The first via-hole 220 is correspondingly coupled to one of the two adjacent pixel electrodes (i.e., one pixel electrode at an upper side in FIG. 7), and the second via-hole 320 is correspondingly coupled to the other of the two adjacent sub-pixels (i.e., other pixel electrode at a bottom side in FIG. 7). In this way, the pixel space is overlapped and utilized, and the space is more fully utilized.

It should be noted that the FIG. 7 is only a schematic diagram showing an exemplary embodiment of the first-layer pixel circuit 200 overlapped with the second-layer pixel circuit 300, but it is not limited to this.

In addition, in some exemplary embodiments provided in the present application, the display substrate includes two opposite sides, one of which is provided with a first gate driving circuit, and the other side is provided with a second gate driving circuit. The first-layer pixel circuit 200 is coupled to the first gate driving circuit, and the second-layer pixel circuit 300 is coupled to the second gate driving circuit. The first gate driving circuit and the second gate driving circuit are independent of each other. The first-layer pixel circuit 200 and the second-layer pixel circuit 300 may be lit simultaneously, or they may be lit respectively according to odd and even rows. The first gate driving circuit and the second gate driving circuit may be a gate driver on array (GOA) driving circuit or a gate chip on flex/film (COF) driving circuit.

In addition, in order to describe the display substrate provided in the embodiments of the present application in more detail, specific structures of the display substrate in some embodiments will be described hereinafter with reference to the drawings.

As shown in FIG. 1 and FIG. 2, in some exemplary embodiments, the display substrate specifically includes:

a base substrate 100;

a buffer layer 110 on the base substrate 100;

a first-layer pixel circuit on the buffer layer 110; wherein a first thin film transistor 210 in the first-layer pixel circuit includes: a first active layer 214, a first gate electrode 211, a first source electrode 212 and a first drain electrode 213;

a first gate insulating layer 120 located between the first active layer 214 and the first gate electrode 11;

a first interlayer dielectric layer 130 located between the first gate electrode 211 and the first source electrode 212 together with the first drain electrode 213;

a base layer 140 located on the first-layer pixel circuit, where the base layer 140 is an organic insulating layer (for example, a PI layer) or an inorganic insulating layer (for example, a PVX layer);

a second-layer pixel circuit located on the base layer 140, where a second thin film transistor 310 in the second-layer pixel circuit includes: a second active layer 314, a second gate electrode 311, a second source electrode 312 and a second drain electrode 313;

a second gate insulating layer 150 located between the second active layer 314 and the second gate electrode 311;

a second interlayer dielectric layer 160 located between the second gate electrode 311 and the second source electrode 312 together with the second drain electrode 313;

a planarization layer 170 located on the second interlayer dielectric layer 160 and covering the second source electrode 312 and the second drain electrode 313; and a pixel electrode layer located on the planarization layer 170, where the pixel electrode layer includes a plurality of pixel electrodes 180 corresponding to various sub-pixels, some of the pixel electrodes 180 are coupled to the first source electrodes 213 through first via-holes 220 in the planarization layer 170, some of the pixel electrodes 180 are coupled to the second source electrodes 313 through second via-holes 320 in the planarization layer 170, and the first via-hole 220 extends through the planarization layer 170, the second interlayer dielectric layer 160, the second gate insulating layer 150 and the base layer 140.

It should be noted that taking the structure of the display substrate in the embodiment shown in FIG. 1 as an example, the first active layer 214 of the first thin film transistor 210 and the second active layer 314 of the second thin film transistor 310 may be made of the same material.

For example, in the display substrate shown in FIG. 1, the first thin film transistor 210 is an LTPS TFT, that is, the first active layer 214 may be fabricated through the LTPS semiconductor process. Correspondingly, specific film structures of the first-layer pixel circuit may be as follows.

In the embodiment shown in FIG. 1, the first-layer pixel circuit includes a first active layer 214, a first gate electrode 211, a first source electrode 212 and a first drain electrode 213. The first active layer 214 is fabricated through the LTPS semiconductor process, and is on the buffer layer 110. The first gate insulating layer 120 is located on the buffer layer 110 and covers the first active layer 214. The first gate electrode 211 is located on the first gate insulating layer 120. The first interlayer dielectric layer 130 is located on the first gate insulating layer 120 and covers the first gate electrode 211. The first source electrode 212 and the first drain electrode 213 are located on the first interlayer dielectric layer 130.

The second thin film transistor 310 is an LTPS TFT, that is, the second active layer 314 may be fabricated through the LTPS semiconductor process. Correspondingly, specific film structures of the second-layer pixel circuit may be as follows.

In the embodiment shown in FIG. 1, the second-layer pixel circuit includes a second active layer 314, a second gate electrode 311, a second source electrode 312 and a second drain electrode 313. The second active layer 314 is fabricated through the LIPS semiconductor process, and is located on the base layer 140. The second gate insulating layer 150 is located on the base layer 140 and covers the second active layer 314. The second gate electrode 311 is located on the second gate insulating layer 150. The second interlayer dielectric layer 160 is located on the second gate insulating layer 150 and covers the second gate electrode 311. The second source electrode 312 and the second drain electrode 313 are located on the second interlayer dielectric layer 160. The planarization layer 170 is located on the second interlayer dielectric layer 160, and covers the second source electrode 312 and the second drain electrode 313.

Taking the structure of the display substrate in the embodiment shown in FIG. 2 as an example, the first active layer 214 of the first thin film transistor 210 and the second active layer 314 of the second thin film transistor 310 may be made of different materials.

For example, in the display substrate shown in FIG. 2, the first thin film transistor 210 is an LTPS TFT, that is, the first active layer 214 may be fabricated through the LTPS semiconductor process. Correspondingly, specific film structures of the first-layer pixel circuit may be as follows.

In the embodiment shown in FIG. 2, the first-layer pixel circuit includes a first active layer 214, a first gate electrode 211, a first source electrode 212 and a first drain electrode 213. The first active layer 214 is fabricated through the LTPS semiconductor process, and is on the buffer layer 110. The first gate insulating layer 120 is located on the buffer layer 110 and covers the first active layer 214. The first gate electrode 211 is located on the first gate insulating layer 120. The first interlayer dielectric layer 130 is located on the first gate insulating layer 120 and covers the first gate electrode 211. The first source electrode 212 and the first drain electrode 213 are located on the first interlayer dielectric layer 130.

The second thin film transistor 310 is an IGZO TFT, that is, the second active layer 314 may be fabricated through the IGZO semiconductor process. Correspondingly, specific film structures of the second-layer pixel circuit may be as follows.

In the embodiment shown in FIG. 2, the second-layer pixel circuit includes a second active layer 314, a second gate electrode 311, a second source electrode 312 and a second drain electrode 313. The second gate electrode 311 is located on the base layer 140. The second gate insulating layer 150 is located on the base layer 140 and covers the second gate electrode 311. The second active layer 314 is fabricated through the LIPS semiconductor process and is located on the second gate insulating layer 150. The second source electrode 312 and the second drain electrode 313 are overlapped on the second active layer 314. The second interlayer dielectric layer 160 is located on the second gate insulating layer 150, and covers the second source electrode 312 and the second drain electrode 313. The planarization layer 170 is located on the second interlayer dielectric layer 160.

It should be noted that the above are only two exemplary embodiments of the display substrate; in practical applications, the specific structures of the first thin film transistor and the second thin film transistor are not limited to the structures in the above exemplary embodiments. The specific film structures of the first thin film transistor and the second thin film transistor may be designed according to actual requirements.

In addition, one embodiment of the present application further provides a method for manufacturing the display substrate provided in the embodiment of the present application. The method includes the following steps.

Step S01: providing a base substrate 100;

Step S02: forming at least two layers of pixel circuits on the base substrate 100; where the at least two layers of pixel circuits includes a first-layer pixel circuit 200 and a second-layer pixel circuit 300 which are in different layers, the first-layer pixel circuit 200 includes a plurality of first thin film transistors 210, the second-layer pixel circuit 300 includes a plurality of second thin film transistors 310, and an orthographic projection of at least one first thin film transistor 210 onto the base substrate 100 at least partially overlaps an orthographic projection of at least one second thin film transistor 310 onto the base substrate 100.

In the foregoing solution, at least two layers of pixel circuits are arranged in the display substrate, that is, at least two layers of thin film transistors are arranged in the display substrate; and in a direction perpendicular to the base substrate 100, the orthographic projections of the thin film transistors in different layers of pixel circuits onto the base substrate 100 at least partially overlap each other. Such design of at least two layers of thin film transistors increases an available space of the pixel circuit by at least 1 time, as compared with the same PPI design of a single-layer of thin film transistors in the related art.

In some exemplary embodiments, when fabricating the display substrate shown in FIG. 1, the foregoing step S02 specifically includes:

Step S021: forming a buffer layer 110 on a base substrate 100;

Step S022: forming the first-layer pixel circuit on the buffer layer 110;

Step S023: forming a base layer 140 on the first-layer pixel circuit, where the base layer 140 is an organic insulating layer or an inorganic insulating layer;

Step S024: forming the second-layer pixel circuit on the base layer 140;

Step S025: forming a pixel electrode layer 180 on the second-layer pixel circuit.

The step S022 specifically includes:

Step S0221: forming a first active layer 214 on the buffer layer 110;

Step S0222: forming a first gate insulating layer 120 on the buffer layer 110, where the first gate insulating layer 120 covers the first active layer 214;

Step S0223: forming a first gate electrode 211 on the first gate insulating layer 120;

Step S0224: forming a first interlayer dielectric layer 130 on the first gate insulating layer 120, where the first interlayer dielectric layer 130 covers the first gate electrode 211;

Step S0225: forming a first source electrode 212 and a first drain electrode 213 on the first interlayer dielectric layer 130.

The step S024 specifically includes:

Step S0241: forming a second active layer 314 on the base layer 140;

Step S0242: forming a second gate insulating layer 150 on the base layer 140, where the second gate insulating layer 150 covers the second active layer 314;

Step S0243: forming a second gate electrode 311 on the second gate insulating layer 150;

Step S0244: forming a second interlayer dielectric layer 160 on the second gate insulating layer 150, where the second interlayer dielectric layer 160 covers the second gate 311;

Step S0245: forming a second source electrode 312 and a second drain electrode 313 on the second interlayer dielectric layer 160;

where the pixel electrode layer 180 includes a plurality of pixel electrodes 180 corresponding to various sub-pixels, some of the pixel electrodes 180 are coupled to the first source electrodes 213 through first via-holes 220 in the planarization layer 170, some of the pixel electrodes 180 are coupled to the second source electrodes 313 through second via-holes 320 in the planarization layer 170, and the first via-hole 220 extends through the planarization layer 170, the second interlayer dielectric layer 160, the second gate insulating layer 150 and the base layer 140.

Each film layer may be formed by a traditional film layer process, and the preparation process of the film layer will not be repeated here.

In some exemplary embodiments, when fabricating the display substrate shown in FIG. 2, the step S022 specifically includes:

Step S0221: forming a first active layer 214 on the buffer layer 110;

Step S0222: forming a first gate insulating layer 120 on the buffer layer 110, where the first gate insulating layer 120 covers the first active layer 214;

Step S0223: forming a first gate electrode 211 on the first gate insulating layer 120;

Step S0224: forming a first interlayer dielectric layer 130 on the first gate insulating layer 120, where the first interlayer dielectric layer 130 covers the first gate electrode 211;

Step S0225: forming a first source electrode 212 and a first drain electrode 213 on the first interlayer dielectric layer 130.

The step S024 specifically includes:

Step S0241: forming a second gate electrode 311 on the base layer 140;

Step S0242: forming a second gate insulating layer 150 on the base layer 140, where the second gate insulating layer 150 covers the second gate electrode 311;

Step S0243: forming a second active layer 314 on the second gate insulating layer 150;

Step S0244: forming a second source electrode 312 and a second drain electrode 313 on the second active layer 314;

Step S0245: forming a second interlayer dielectric layer 160 on the second gate insulating layer 150, where the second interlayer dielectric layer 160 covers the second source electrode 312 and the second drain electrode 313;

Step S0246: forming a planarization layer 170 on the second interlayer dielectric layer 160.

The pixel electrode layer includes a plurality of pixel electrodes 180 corresponding to various sub-pixels, some of the pixel electrodes 180 are coupled to the first source electrodes 213 through first via-holes 220 in the planarization layer 170, some of the pixel electrodes 180 are coupled to the second source electrodes 313 through second via-holes 320 in the planarization layer 170, and the first via-hole 220 extends through the planarization layer 170, the second interlayer dielectric layer 160, the second gate insulating layer 150 and the base layer 140.

Those skilled in the art can understand that steps, measures, or solutions in various operations, methods or processes that have been discussed in the present disclosure may be alternated, changed, combined, or deleted. Further, other steps, measures, or solutions in various operations, methods or processes that have been discussed in the present disclosure can be alternated, modified, rearranged, decomposed, combined, or deleted. Further, steps, measures, or solutions in various operations, methods or processes in the conventional technologies can be alternated, modified, rearranged, decomposed, combined, or deleted.

In the descriptions of the present disclosure, it needs to be understood that orientation or positional relationship indicated by the term of "center", "up", "down", "front", "rear", "left", "right", "vertical", "horizontal", "top", "bottom", "inside", or "outer", etc., is based on the drawings, and are only for the convenience of describing the present disclosure and simplifying the description, and not intended to indicate or imply that the device or element as referred to must have a specific orientation or be constructed and operated in a specific orientation, and therefore cannot be understood as a limitation to the present disclosure.

The terms "first" and "second" are used for descriptive purposes only, and cannot be understood as indicating or implying relative importance or implicitly indicating the quantity of technical features as referred to. Therefore, the features defined by "first" and "second" may explicitly or implicitly include one or more of the features. In the descriptions of the present disclosure, unless otherwise stated, "a plurality" means two or more.

In the description of the present disclosure, it should be noted that the term of "installation", "connected", or "connecting" should be understood in a broad sense unless explicitly stated and limited. For example, it may be fixed or removable connection, or may be integral connection; it may be direct connection or indirect connection through an intermediate medium, or, it may be internal communication of two elements. For those of ordinary skill in the art, the specific meanings of the above terms in the present disclosure may be understood on a case-by-case basis.

In the descriptions of this specification, specific features, structures, materials, or characteristics may be combined in a suitable manner in any one or more embodiments or examples.

It should be understood that although the steps in the flowchart of the drawings are sequentially displayed in accordance with the directions of the arrows, these steps are not necessarily performed in the order indicated by the arrows. Unless explicitly stated herein, the execution of these steps is not strictly limited, and they may be performed in other orders. Moreover, at least a part of the steps in the flowchart of the drawings may include multiple sub-steps or multiple stages. These sub-steps or stages are not necessarily performed at the same time, but may be performed at different times; and they are not necessarily performed sequentially, but may be performed in turn or alternately with other steps or at least a part of sub-steps or stages of other steps.

The above descriptions are merely some embodiments of the present disclosure. It should be noted that for those of ordinary skill in the art, without departing from the principles of the present disclosure, various improvements and modifications can be made. These improvements and modifications should fall within the protection scope of the present disclosure.

What is claimed is:

1. A display substrate, comprising:
a base substrate; and
at least two layers of different pixel circuits on the base substrate;
wherein the at least two layers of different pixel circuits include a first-layer pixel circuit and a second-layer pixel circuit which are in different layers; the first-layer pixel circuit includes a plurality of first thin film transistors; the second-layer pixel circuit includes a plurality of second thin film transistors; and an orthographic projection of at least one first thin film transistor onto the base substrate at least partially overlaps an orthographic projection of at least one second thin film transistor onto the base substrate;
wherein the first-layer pixel circuit and the second-layer pixel circuit are electrically coupled to pixel electrodes of different sub-pixels.

2. The display substrate according to claim 1, wherein
at least two of the first thin film transistors are different types of thin film transistors with active layers of different materials, or all of the first thin film transistors are the same type of thin film transistors with the active layers of the same material;
at least two of the second thin film transistors are different types of thin film transistors with active layers of different materials, or all of the second thin film transistors are the same type of thin film transistors with the active layers of the same material; and
at least one of the first thin film transistors and at least one of the second thin film transistors are different types of thin film transistors with active layers of different materials, or, at least one of the first thin film transistors and at least one of the second thin film transistors are the same type of thin film transistors with the active layers of the same material.

3. The display substrate according to claim 2, wherein
at least one of the first thin film transistors is at least one of a metal oxide thin film transistor with a metal oxide active layer, a low temperature polysilicon thin film transistor with a low temperature polysilicon active layer, and an amorphous silicon thin film transistor with an amorphous silicon active layer;
at least one of the second thin film transistors is at least one of a metal oxide thin film transistor with a metal oxide active layer, a low temperature polysilicon thin film transistor with a low temperature polysilicon active layer, and an amorphous silicon thin film transistor with an amorphous silicon active layer.

4. The display substrate according to claim 3, wherein
the display substrate includes at least three sub-pixels; the at least three sub-pixels include a first sub-pixel, a second sub-pixel, and a third sub-pixel; each sub-pixel is provided with a corresponding pixel electrode;
the pixel electrode of at least one first sub-pixel is coupled to at least one first thin film transistor having an oxide active layer or an amorphous silicon active layer, or coupled to at least one second thin film transistor having an oxide active layer or an amorphous silicon active layer;
the pixel electrode of at least one second sub-pixel is coupled to at least one first thin film transistor having an oxide active layer or an amorphous silicon active layer, or coupled to at least one second thin film transistor having an oxide active layer or an amorphous silicon active layer; and the pixel electrode of at least one third sub-pixel is coupled to at least one first thin film transistor having a low-temperature polysilicon active layer, or coupled to at least one second thin film transistor having a low-temperature polysilicon active layer.

5. The display substrate according to claim 3, wherein the first sub-pixel is a green sub-pixel, the second sub-pixel is a blue sub-pixel and the third sub-pixel is a red sub-pixel.

6. The display substrate according to claim 5, wherein each first thin film transistor in the first-layer pixel circuit is a metal oxide thin film transistor or an amorphous silicon thin film transistor; each second thin film transistor in the second-layer pixel circuit is a low-temperature polysilicon thin film transistor; each of the pixel electrodes of the first sub-pixel and the second sub-pixel is coupled to the corresponding first thin film transistor in the first-layer pixel circuit; and the pixel electrode of the third sub-pixel is coupled to the corresponding second thin film transistor in the second-layer pixel circuit.

7. The display substrate according to claim 6, wherein the first thin film transistor and the second thin film transistor are both NMOS transistors.

8. The display substrate according to claim 3, wherein the first thin film transistor is coupled to the pixel electrode in the corresponding sub-pixel through a first via-hole; and the second thin film transistor is coupled to the pixel electrode in the corresponding sub-pixel through a second via-hole;
an orthographic projection of the first thin film transistor onto the base substrate and an orthographic projection of the second thin film transistor onto the base substrate at least partially do not overlap each other, with a non-overlapping area defined between the orthographic projection of the first thin film transistor onto the base substrate and the orthographic projection of the second thin film transistor onto the base substrate;
the first via-hole and the second via-hole are both located in the non-overlapping area; and an orthographic projection of the first via-hole onto the base substrate does not overlap an orthographic projection of the second via-hole onto the base substrate.

9. The display substrate according to claim 8, wherein the first via-hole and the second via-hole are located at two sides of the non-overlapping area.

10. The display substrate according to claim 1, wherein the display substrate includes two opposite sides; one of the two opposite sides is provided with a first gate driving circuit, and the other one of the two opposite sides is provided with a second gate driving circuit; the first-layer pixel circuit is coupled to the first gate driving circuit, and the second-layer pixel circuit is coupled to the second gate driving circuit; and the first gate driving circuit and the second gate driving circuit are independent of each other.

11. The display substrate according to claim 10, wherein the first gate driving circuit and the second gate driving circuit are gate driver on array (GOA) driving circuits or a gate chip on flex/film (COF) driving circuits.

12. The display substrate according to claim 1, wherein the display substrate specifically includes:
a buffer layer on the base substrate; wherein the first-layer pixel circuit is on the buffer layer, and the first thin film transistor in the first-layer pixel circuit includes: a first active layer, a first gate electrode, a first source electrode and a first drain electrode;
a first gate insulating layer located between the first active layer and the first gate electrode;
a first interlayer dielectric layer located between the first gate electrode and the first source electrode together with the first drain electrode;
a base layer located on the first-layer pixel circuit, wherein the base layer is an organic insulating layer or an inorganic insulating layer; wherein the second-layer pixel circuit is located on the base layer, and the second thin film transistor in the second-layer pixel circuit includes: a second active layer, a second gate electrode, a second source electrode and a second drain electrode;
a second gate insulating layer located between the second active layer and the second gate electrode;
a second interlayer dielectric layer located between the second gate electrode and the second source electrode together with the second drain electrode;
a planarization layer located on the second interlayer dielectric layer and covering the second source electrode and the second drain electrode; and
a pixel electrode layer located on the planarization layer, wherein the pixel electrode layer includes a plurality of pixel electrodes corresponding to various sub-pixels, some of the pixel electrodes are coupled to the first source electrodes through first via-holes in the planarization layer, some of the pixel electrodes are coupled to the second source electrodes through second via-holes in the planarization layer, and the first via-hole extends through the planarization layer, the second interlayer dielectric layer, the second gate insulating layer and the base layer.

13. The display substrate according to claim 1, wherein the display substrate specifically includes:
a buffer layer on the base substrate; wherein the first-layer pixel circuit is on the buffer layer, and the first thin film transistor in the first-layer pixel circuit includes: a first active layer, a first gate electrode, a first source electrode and a first drain electrode;
a first gate insulating layer located between the first active layer and the first gate electrode;
a first interlayer dielectric layer located between the first gate electrode and the first source electrode together with the first drain electrode;
a base layer located on the first-layer pixel circuit, wherein the base layer is an organic insulating layer or an inorganic insulating layer; wherein the second-layer pixel circuit is located on the base layer, and the second thin film transistor in the second-layer pixel circuit includes: a second active layer, a second gate electrode, a second source electrode and a second drain electrode;
a second gate insulating layer located between the second active layer and the second gate electrode;
a second interlayer dielectric layer located on the second gate insulating layer and covering the second source electrode and the second drain electrode;
a planarization layer located on the second interlayer dielectric layer; and
a pixel electrode layer located on the planarization layer, wherein the pixel electrode layer includes a plurality of pixel electrodes corresponding to various sub-pixels, some of the pixel electrodes are coupled to the first source electrodes through first via-holes in the planarization layer, some of the pixel electrodes are coupled to the second source electrodes through second via-holes in the planarization layer, and the first via-hole extends through the planarization layer, the second interlayer dielectric layer, the second gate insulating layer and the base layer; and the second via-hole extends through the planarization layer and into the second interlayer dielectric layer.

14. A method for manufacturing a display substrate, comprising:
providing a base substrate; and
forming at least two layers of different pixel circuits on the base substrate; wherein the at least two layers of different pixel circuits includes a first-layer pixel circuit and a second-layer pixel circuit which are in different layers, the first-layer pixel circuit includes a plurality of first thin film transistors, the second-layer pixel circuit includes a plurality of second thin film transistors, and an orthographic projection of at least one first thin film transistor onto the base substrate at least partially overlaps an orthographic projection of at least one second thin film transistor onto the base substrate;
wherein the first-layer pixel circuit and the second-layer pixel circuit are electrically coupled to pixel electrodes of different sub-pixels.

15. The method according to claim 14, wherein the forming at least two layers of different pixel circuits on the base substrate, includes:
forming a buffer layer on the base substrate;
forming the first-layer pixel circuit on the buffer layer;
forming a base layer on the first-layer pixel circuit, wherein the base layer is an organic insulating layer or an inorganic insulating layer;
forming the second-layer pixel circuit on the base layer;
forming a pixel electrode layer on the second-layer pixel circuit.

16. The method according to claim 15, wherein the forming the first-layer pixel circuit on the buffer layer, includes:
forming a first active layer on the buffer layer;
forming a first gate insulating layer on the buffer layer, wherein the first gate insulating layer covers the first active layer;
forming a first gate electrode on the first gate insulating layer;
forming a first interlayer dielectric layer on the first gate insulating layer, wherein the first interlayer dielectric layer covers the first gate electrode;
forming a first source electrode and a first drain electrode on the first interlayer dielectric layer;
wherein the forming the second-layer pixel circuit on the base layer, includes:
forming a second active layer on the base layer;
forming a second gate insulating layer on the base layer, wherein the second gate insulating layer covers the second active layer;
forming a second gate electrode on the second gate insulating layer;
forming a second interlayer dielectric layer on the second gate insulating layer, wherein the second interlayer dielectric layer covers the second gate;
forming a second source electrode and a second drain electrode on the second interlayer dielectric layer;
forming a planarization layer on the second interlayer dielectric layer;
wherein the pixel electrode layer includes a plurality of pixel electrodes corresponding to various sub-pixels, some of the pixel electrodes are coupled to the first source electrodes through first via-holes in the planarization layer, some of the pixel electrodes are coupled to the second source electrodes through second via-holes in the planarization layer, and the first via-hole extends through the planarization layer, the second interlayer dielectric layer, the second gate insulating layer and the base layer.

17. The method according to claim 15, wherein the forming the first-layer pixel circuit on the buffer layer, includes:
forming a first active layer on the buffer layer;
forming a first gate insulating layer on the buffer layer, wherein the first gate insulating layer covers the first active layer;
forming a first gate electrode on the first gate insulating layer;
forming a first interlayer dielectric layer on the first gate insulating layer, wherein the first interlayer dielectric layer covers the first gate electrode;
forming a first source electrode and a first drain electrode on the first interlayer dielectric layer;
wherein the forming the second-layer pixel circuit on the base layer, includes:
forming a second gate electrode on the base layer;
forming a second gate insulating layer on the base layer, wherein the second gate insulating layer covers the second gate electrode;
forming a second active layer on the second gate insulating layer;
forming a second source electrode and a second drain electrode on the second active layer;
forming a second interlayer dielectric layer on the second gate insulating layer, wherein the second interlayer dielectric layer covers the second source electrode and the second drain electrode;
forming a planarization layer on the second interlayer dielectric layer;
wherein the pixel electrode layer includes a plurality of pixel electrodes corresponding to various sub-pixels, some of the pixel electrodes are coupled to the first source electrodes through first via-holes in the planarization layer, some of the pixel electrodes are coupled to the second source electrodes through second via-holes in the planarization layer, and the first via-hole extends through the planarization layer, the second interlayer dielectric layer, the second gate insulating layer and the base layer; and the second via-hole extends through the planarization layer and into the second interlayer dielectric layer.

18. The display substrate according to claim 1, wherein the first-layer pixel circuit and the second-layer pixel circuit are two different pixel circuits.

19. The display substrate according to claim 18, wherein the first-layer pixel circuit is used to drive red sub-pixels, and the second-layer pixel circuit is used to drive blue sub-pixels and green sub-pixels.

20. The method according to claim 15, wherein he first-layer pixel circuit and the second-layer pixel circuit are two different pixel circuits, and the first-layer pixel circuit is used to drive red sub-pixels, and the second-layer pixel circuit is used to drive blue sub-pixels and green sub-pixels.

* * * * *